(12) United States Patent
Chakraborty et al.

(10) Patent No.: US 12,047,048 B2
(45) Date of Patent: Jul. 23, 2024

(54) CURRENT MODE TRANSCONDUCTANCE CAPACITANCE FILTER WITHIN A RADIO FREQUENCY DIGITAL TO ANALOG CONVERTER

(71) Applicant: International Business Machines Corporation, Armonk, NY (US)

(72) Inventors: Sudipto Chakraborty, Plano, TX (US); Raymond Richetta, Rochester, MN (US); Pat Rosno, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 917 days.

(21) Appl. No.: 16/952,723

(22) Filed: Nov. 19, 2020

(65) Prior Publication Data
US 2022/0158626 A1      May 19, 2022

(51) Int. Cl.
| | |
|---|---|
| *H03M 1/80* | (2006.01) |
| *B82Y 10/00* | (2011.01) |
| *G06N 10/00* | (2022.01) |
| *H03H 11/04* | (2006.01) |
| *H03M 1/66* | (2006.01) |

(52) U.S. Cl.
CPC .......... *H03H 11/0422* (2013.01); *B82Y 10/00* (2013.01); *G06N 10/00* (2019.01); *H03M 1/66* (2013.01)

(58) Field of Classification Search
CPC ............ H03H 11/0422; H03H 11/1213; B82Y 10/00; G06N 10/00; G06N 10/40; H03M 1/66
See application file for complete search history.

(56) References Cited

U.S. PATENT DOCUMENTS

| | | |
|---|---|---|
| 4,843,343 A | 6/1989 | Pace |
| 5,412,335 A | 5/1995 | Jackson et al. |
| 6,433,626 B1 | 8/2002 | Guimaraes |
| 7,098,718 B2 | 8/2006 | Yang et al. |
| 9,148,183 B2 | 9/2015 | Alzaher |
| 2006/0255997 A1* | 11/2006 | Li ............................ H03F 3/24 341/156 |
| 2012/0019314 A1 | 1/2012 | Shih et al. |

OTHER PUBLICATIONS

Office Action received for GB Patent Application Serial No. 2115782.1 dated Jul. 20, 2022, 15 pages.
(Continued)

*Primary Examiner* — Jean B Jeanglaude
(74) *Attorney, Agent, or Firm* — Amin, Turocy & Watson, LLP

(57) ABSTRACT

A filter stage system, includes a continuous time baseband filter comprising a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole, and wherein the continuous time baseband filter generates a filtered current, and a mirroring component mirrors the filtered current to an output.

23 Claims, 16 Drawing Sheets

(56) References Cited

OTHER PUBLICATIONS

Alaybeyoglu et al., "A New Current Mode Implementation of the Reconfigurable Analog Baseband Low Pass Filter With Cell-based Variable Transconductance Amplifier", 2017 24th IEEE International Conference on Electronics, Circuits and Systems, Dec. 5, 2017, pp. 148-151.

Sun et al., "Structure Generation of Current-Mode Two Integrator Loop Dual Output-OTA Grounded Capacitor Filters", IEEE Transactions on Circuits and Systems-II: Analog and Digital Signal Processing, Institute of Electrical and Electronics Engineers INC, 345 East 47 Street, New York, NY 10017, USA, vol. 43, No. 9, Sep. 1, 1996, pp. 659-663.

Yodprasit et al., "VHF Current-mode Filter Based on Intrinsic Biquad of the Regulated Cascade Topology", Conference Proceedings/ ISCAS 2001, the 2001 IEEE International Symposium on Circuits and Systems: May 6-9, 2001, Sydney Convention and Exhibition Centre, Darling Harbour, Sydney, Australia, IEEE Service Center, Piscataway, NJ, vol. 1, May 6, 2001, pp. 172-175.

Robinson et al., "Current-mode Continuous-time Filters: Two Design Approaches", Proceedings of the Midwest Symposium on Circuits and Systems, Monterey, May 14-17, 1991, New York, IEEE, US, vol. 1, May 14, 1991, pp. 352-355.

Mahattanakul et al., "Modular log-domain filters based upon linear Gm-C filter synthesis" IEEE Transactions on Circuits and Systems I: Fundamental Theory and Applications Year: 1999, vol. 46, Issue: 12.

Li et al., "A 70-280 MHz frequency and Q tunable 53 dB SFDR Gm-C filter for ultra-wideband" 2010 IEEE Asian Solid-State Circuits Conference.

Itakura et al., "A 2.7-V, 200-kHz, 49-dBm, stopband-IIP3, low-noise, fully balanced gm-C filter IC" IEEE Journal of Solid-State Circuits; Year: 1999, vol. 34, Issue: 8.

Gambhir et al., "A low power 1.3GHZ dual-path current mode Gm-C filter" 2008 IEEE Custom Integrated Circuits Conference.

Voorman et al., "Tunable high-frequency Gm-C filters" IEEE Journal of Solid-State Circuits; Year: 2000, vol. 35, Issue: 8.

Response to the Examination Report of Jul. 20, 2022 for GB Patent Application Serial No. 2115782.1 dated Nov. 18, 2022, 5 pages.

* cited by examiner

CURRENT MODE TRANSCONDUCTANCE CAPACITANCE FILTER WITHIN A RADIO FREQUENCY DIGITAL TO ANALOG CONVERTER

TECHNICAL FIELD

The subject disclosure relates to an integrated radio frequency digital to analog converter (RF DAC), and more specifically, utilizing a current mode transconductance-capacitance filter to generate a filtered current and provide a path to reuse current between the filter and adjacent stages in a signal chain.

BACKGROUND

Quantum computing is generally the use of quantum-mechanical phenomena to perform computing and information processing functions. Quantum computing can be viewed in contrast to classical computing, which generally operates on binary values with transistors. That is, while classical computers can operate on two basis states that are either 0 or 1, quantum computers operate on quantum bits that comprise superposition of both 0 and 1 based on probability, can entangle multiple quantum bits, and use interference. Quantum computing is emerging as a new paradigm to solve a wide class of problems that show unfavorable scaling on a conventional classical high-performance computer. Arbitrary waveform generation capability with variable amplitude and low distortion is desirable in multiple contexts, including in the control of qubits in the field of quantum computing. In particular, radio frequency digital to analog converters (RFDACs) is valuable in a variety of applications, including wireless transmitters and implementing control pulses for qubits. The filter implementation and the interface between the filter and the other elements of the signal chain are of significance in such designs. Continuous-time filters are well suited for high dynamic range, low power active filter implementations. Current mode signal processing is well suited for low distortion applications, as it reduces voltage swings at various nodes of interest. However, a traditional current mode input filter using an operational amplifier consumes a significant amount of power and has limitations with high frequency applications.

SUMMARY

The following presents a summary to provide a basic understanding of one or more embodiments of the invention. This summary is not intended to identify key or critical elements, delineate scope of particular embodiments or scope of claims. Its sole purpose is to present concepts in a simplified form as a prelude to the more detailed description that is presented later. In one or more embodiments described herein, systems, computer-implemented methods, apparatus and/or computer program products facilitate an integrated radio frequency digital to analog converter (RF DAC), and more specifically, utilizing a current mode transconductance-capacitance filter to generate a filtered current and provide a path to reuse current between the filter and adjacent stages in a signal chain.

In accordance with an embodiment, a system comprises a processor that executes the following system executable components stored in memory: a radio-frequency digital to analog converter (RFDAC) operating in current mode and a continuous-time baseband filter that comprises a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole, and wherein the continuous-time baseband filter generates a filtered current.

In an optional aspect, a mirroring component, operating in the current mode, mirrors the filtered current to an output.

In accordance with an embodiment, a system implemented method, comprises: a radio-frequency digital to analog converter, to execute system executable components to perform the following acts: to operate in current mode along with a baseband filter wherein the inputs and outputs of system blocks are represented as currents.

In an optional aspect, the system implemented method further comprises mapping, by the system, a mirroring component, operating in the current mode, mirrors the filtered current to an output wherein it selectively changes a mirroring ratio to achieve a variable gain relative to a fine baseline step.

DETAILED DESCRIPTION

Figure 1:
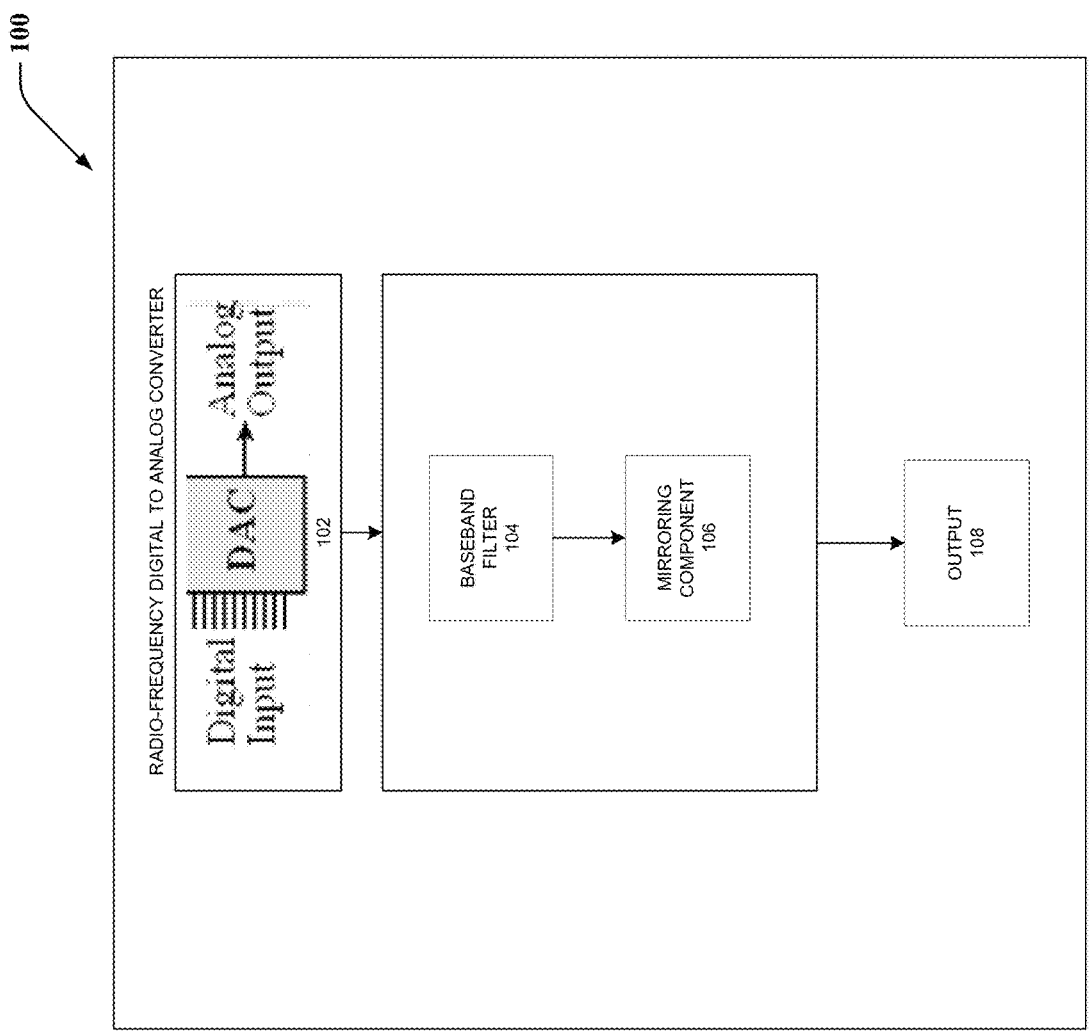
FIG. 1 illustrates a block diagram of an example system implementation that implements an integrated digital to analog converter (DAC) utilizing a current mode signal path.

The following detailed description is merely illustrative and is not intended to limit embodiments and/or application or uses of embodiments. Furthermore, there is no intention to be bound by any expressed or implied information presented in the preceding Summary section, or in the Detailed Description section. One or more embodiments are now described with reference to the drawings, wherein like reference numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

The subject disclosure relates generally to systems and methods that implement a current mode end-to-end path from radio frequency digital to analog converter (RF DAC) through output which enables realization of a favorable set of trade-offs regarding power consumption and distortion. The elements of a signal path are RFDAC, baseband filter, mirror, and an output stage. Benefits can be achieved by implementing an entire chain in current mode or implementing sub-elements of the chain in current mode.

Embodiments integrate a radio frequency digital to analog converter utilizing a current mode transconductance capacitance filter to generate a filtered current and provide a path to current reuse between the filter and adjacent stages in a signal chain. Current mode signal processing is well suited for low distortion applications, as it reduces voltage swings at various nodes of interest. However, traditional current mode input filters using an operational amplifier consume significant amount of power and have limitations to high frequency applications. Embodiments disclosed and claimed herein propose a promising solution to this problem by introducing a current mode signal path design in the implementation of an integrated digital to analog converter. Implementing an efficient current-mode filter stage offers multiple benefits in the context of a proposed end-to-end current mode analog signal path RF DAC architecture that has been developed for low-power, low-distortion arbitrary waveform generation applications. It provides a path to current reuse between the filter and adjacent stages in the signal chain. It also avoids introducing additional current-voltage conversions in the signal path (such conversions may be included in the feedback path), which helps limit undesirable distortion products and aligns well with low output amplitude requirements.

Quantum computation uses a qubit as its essential unit instead of a classical computing bit. A qubit (e.g., quantum binary digit) is a quantum-mechanical analog of a classical bit. Whereas classical bits can employ on only one of two basis states (e.g., 0 or 1), qubits can employ on superpositions of those basis states (e.g., $\alpha|0\rangle + \beta|1\rangle$, where $\alpha$ and $\beta$ are complex scalars such that $|\alpha|^2 + |\beta|^2 = 1$), allowing several qubits to theoretically hold exponentially more information than the same number of classical bits. Thus, quantum computers (e.g., computers that employ qubits instead of solely classical bits) can, in theory, quickly solve problems that can be extremely difficult for classical computers. The bits of a classical computer are simply binary digits, with a value of either 0 or 1. Almost any device with two distinct states can serve to represent a classical bit: a switch, a valve, a magnet, a coin, or similar binary-type state measure. Qubits, partaking of the quantum mystique, can occupy a superposition of 0 and 1 states. It's not that the qubit can have an intermediate value, such as 0.63; when the state of the qubit is measured, the result is either 0 or 1. But in the course of a computation, a qubit can act as if it were a mixture of states—for example: 63 percent 0 and 37 percent 1. General quantum programs require coordination of quantum and classical parts of a computation. One way to think about general quantum programs is to identify processes and abstractions involved in specifying a quantum algorithm, transforming the algorithm into executable form, running an experiment or simulation, and analyzing the results. A notion throughout these processes is the of intermediate representations. An intermediate representation (IR) of computation is neither its source language description nor the target machine instructions, but something in between. Compilers may use several IRs during the process of translating and optimizing a program. The input is a source code describing a quantum algorithm and compile time parameter(s). The output is a combined quantum/classical program expressed using a high-level IR. A distinction between quantum and classical computer is that the quantum computer is probabilistic, thus measurements of algorithmic outputs provide a proper solution within an algorithm specific confidence interval. The computation is then repeated until a satisfactory probable certainty of solution can be achieved.

By processing information using laws of quantum mechanics, quantum computers offer novel ways to perform computation tasks such as molecular calculations, optical photons, optimization, and many more. Many algorithms are introduced to perform such computational tasks efficiently. In particular, radio frequency digital to analog converters are valuable in a variety of applications, including wireless transmitters and implementing control pulses for qubits. There are few challenges with designs that use voltage mode representations for a signal path which includes high dynamic range requirements at block interfaces, leading to nonlinear behavior and generation of higher amplitude distortion products and independent power per block with no opportunity for power efficiency that comes from current reuse. Thus, embodiments herein propose an efficient current mode filter design in implementation of an integrated RF DAC solution to develop low-power distortion arbitrary waveform generation applications. This provides a path to reuse current between a filter and adjacent stages in a signal chain and avoid introducing additional current-voltage conversions in a signal path (e.g., such conversions may be included in a feedback path), which helps limit undesirable distortion products; and it also aligns well with low output amplitude requirements.

FIG. 1 illustrates a block diagram of an example system 100 that can access data and process that data using variable computing components depicted in accordance with one or more embodiments described herein. The system 100 can facilitate a process of assessing and identifying large amounts of various forms of data, using machine learning, and training a neural network or other type of model. The system 100 can also generate predictive recommendations to an individual level with context in accordance with one or more embodiments described herein. Aspects of systems (e.g., system 100 and the like), apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform operations described herein. Repetitive description of like elements employed in one or more embodiments described herein is omitted for sake of brevity.

The system 100 facilitates an integrated radio frequency digital to analog converter (RFDAC) utilizing a current mode signal path. Embodiments relate to maintaining elements of a signal path, RFDAC, baseband filter, mirror, and an output stage. Benefits can be achieved by implementing an entire chain in current mode or implementing sub-elements of the chain in current mode.

System 100 can optionally include a server device, one or more networks and one or more devices (not shown). The system 100 can also include or otherwise be associated with a radio frequency digital to analog converter 102 operating in current mode which comprises a continuous-time baseband filter 104 operating in current mode wherein input and output of the system blocks are represented as currents. A mirroring component 106 mirrors the filtered current to an output 108 operating in current mode.

In an implementation, a current mode end-to-end path from radio frequency digital to analog converter through output 108 enables realization of low-power, low-distortion arbitrary waveform generation applications. The continuous-time baseband filter 104 comprises a feedback loop that employs at least one first impedance node and at least one second impedance node, wherein the at least one first impedance node has higher impedance than the at least one second impedance node, and wherein the at least one first impedance node provides a dominant pole and the at least one second impedance node provides a non-dominant pole, and wherein the continuous time baseband filter generates a filtered current. The mirroring component 106 mirrors the filtered current to output 108 wherein it selectively changes a mirroring ratio to achieve a variable gain relative to a fine baseline step.

System 100 can be any suitable computing device or set of computing devices that can be communicatively coupled to devices, non-limiting examples of which can include, but are not limited to, a server computer, a computer, a mobile computer, a mainframe computer, an automated testing system, a network storage device, a communication device, a web server device, a network switching device, a network routing device, a gateway device, a network hub device, a network bridge device, a control system, or any other suitable computing device. A device can be any device that can communicate information with the system 100 and/or any other suitable device that can employ information provided by system 100. It is to be appreciated that system 100, components, models or devices can be equipped with communication components (not shown) that enable communication between the system, components, models, devices, etc. over one or more networks.

The various components of system 100 can be connected either directly or via one or more networks. Such networks can include wired and wireless networks, including, but not limited to, a cellular network, a wide area network (WAN) (e.g., the Internet), or a local area network (LAN), non-limiting examples of which include cellular, WAN, wireless fidelity (Wi-Fi), Wi-Max, WLAN, radio communication, microwave communication, satellite communication, optical communication, sonic communication, or any other suitable communication technology. Moreover, the aforementioned systems and/or devices have been described with respect to interaction between several components. It may be appreciated that such systems and components can include these components or sub-components specified therein, some of the specified components or sub-components, and/or additional components. Sub-components may also be implemented as components communicatively coupled to other components rather than included within parent components. Further yet, one or more components and/or sub-components can be combined into a single component providing aggregate functionality. The components can also interact with one or more other components not specifically described herein for the sake of brevity, but known by those of skill in the art.

The subject computer processing systems, methods apparatuses and/or computer program products can be employed to solve new problems that arise through advancements in technology, computer networks, the Internet and the like.

In today's digital world, one of the largest growth areas in electronics has been in applications of wireless communications. Modern radio frequency systems such as superconducting quantum bit controllers are based on wideband multi-channel architecture. The use of vector signal generators with IQ modulators and analog synthesizers for RF signal pose limitations due to its calibration complexity and cost. Thus, digital-to-analog converts are valuable to embody signal processing, modulation, and signal generation. Moreover, radiofrequency digital to analog converters (RF DACs) are valuable in a variety of applications, including wireless transmitters and implementing control pulses for qubits and address signal-to-noise ratio. In particular, RFDAC implementations ideally can target low distortion and while minimizing power consumption. In general, these objectives form a trade space that can be navigated in the course of design. Implementation of a RFDAC signal path can involve voltage mode signals, current mode signals, or a combination of both. Thus, embodiments propose a promising solution by introducing a current mode signal path design in an integrated digital to analog converter. An efficient current-mode filter offers multiple benefits in context of an end-to-end current mode analog signal path RFDAC architecture developed for low-power, low-distortion arbitrary waveform generation applications. It provides a path to reuse current between a filter and adjacent stages in a signal chain. It also avoids introducing additional current-voltage conversions in a signal path (e.g., such conversions may be included in a feedback path), which mitigates undesirable distortion products and aligns well with low output amplitude requirements.

Figure 2:
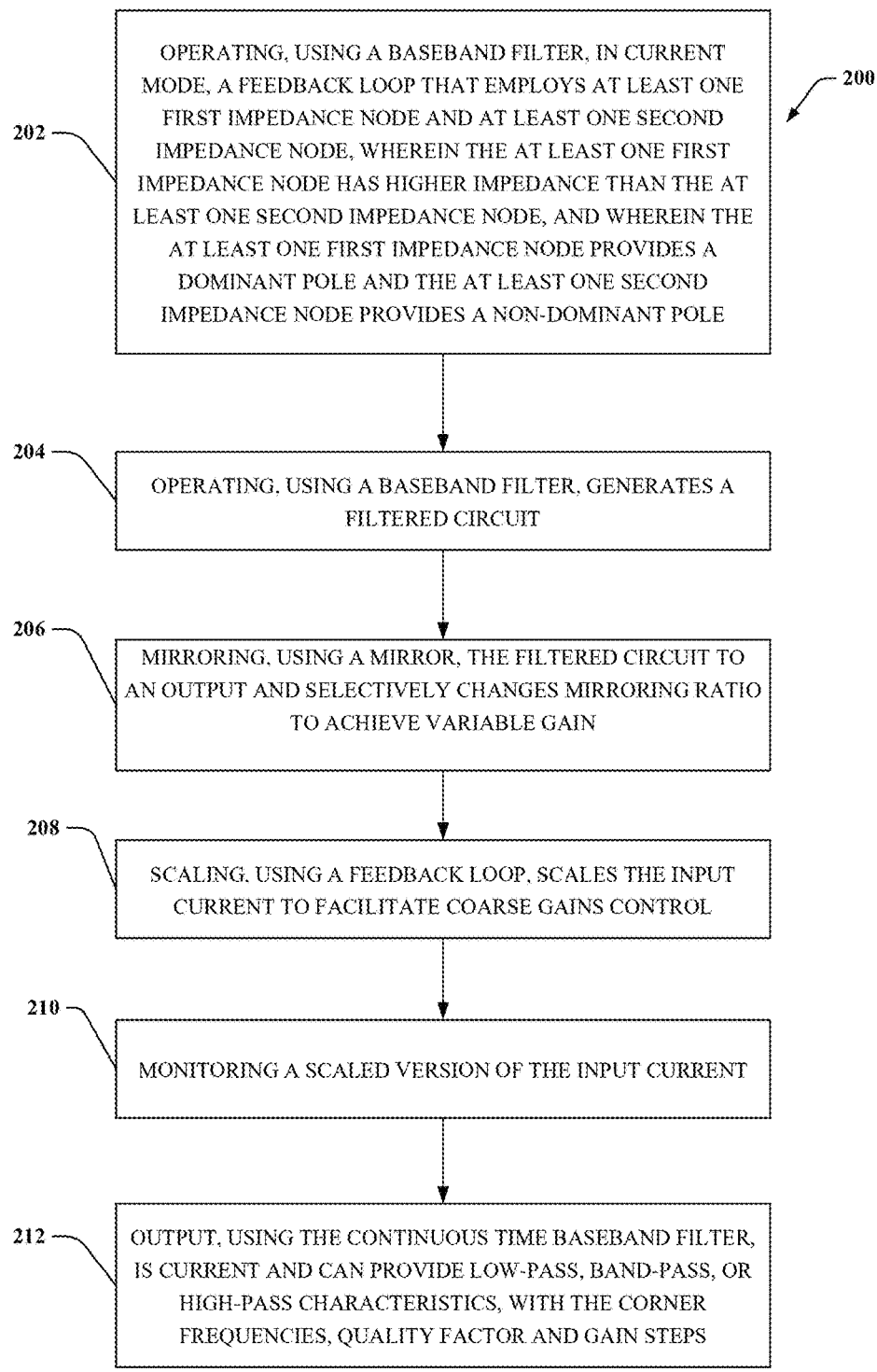
FIG. 2 illustrates an example flowchart of an integrated radio frequency digital to analog converter utilizing a current mode transconductance-capacitance filter.

FIG. 2 illustrates an example flowchart of an integrated radio frequency digital to analog converter utilizing a current mode transconductance-capacitance filter. As described in flowchart 200, a system comprises a radio-frequency digital to analog converter (RFDAC) wherein a current-mode baseband filter is used. At 202, a continuous-time baseband filter comprises a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole. At 204, the continuous time baseband filter generates a filtered current. At 206, a mirroring component selectively changes a mirroring ratio to achieve a variable gain relative to a fine baseline step. At 208, a scaling component scales the input current of the feedback loop to facilitate coarse gains control. At 210, a monitoring component monitors a scaled version of the input current to mitigate distortion interference with monitoring. A set of additional poles are placed between the continuous time baseband filter and the mirroring component facilitate high-order filtering and mitigate compromising the stability of the continuous time baseband filter. At 212, a subset of the plurality of cascaded continuous time baseband filters provides low-pass, band-pass or high-pass characteristics with corner frequencies, quality factor, or gain control set by digital control. The output from this continuous time filter is current, and multiple such filters can be easily cascaded to realize higher order current mode filters. A filter can provide low-pass, band-pass, or high-pass characteristics, with the corner frequencies, quality factor, and gain steps set by digital control.

Wireless communication applications are challenging due to the speed and frequency-domain performance requirements of modern data converters. High speed digital to analog converters require fewer mixing and filtering stages to produce an effective output. Today's technological advancements face many challenges to meet increasing demand for bandwidth in a congested frequency spectrum. This increases signal chain complexity as frequency planning compromises size, power, and performance requirements. An ability to utilize a frequency spectrum creates enhanced user experiences and enables new system capabilities. Radio frequency converters are used to convert microwave signals into lower or higher frequency ranges for a wide range of processing options. Reducing size and cost of telecommunication and military systems is driving evolution of modern digital to analog converters to integrate more functionalities into a single chip. Certain high-speed digital to analog converters incorporate digital signal processing and conditioning functionalities such as filters, complex modulation, and numerically controlled oscillators. This enables direct generation of complex RF signals efficiently and compactly. In a traditional RFDAC architecture, information is processed from one frequency and translated to another frequency. Embodiments disclosed herein perform versatile signal processing at a low frequency and reduced power consumption.

Figure 3:
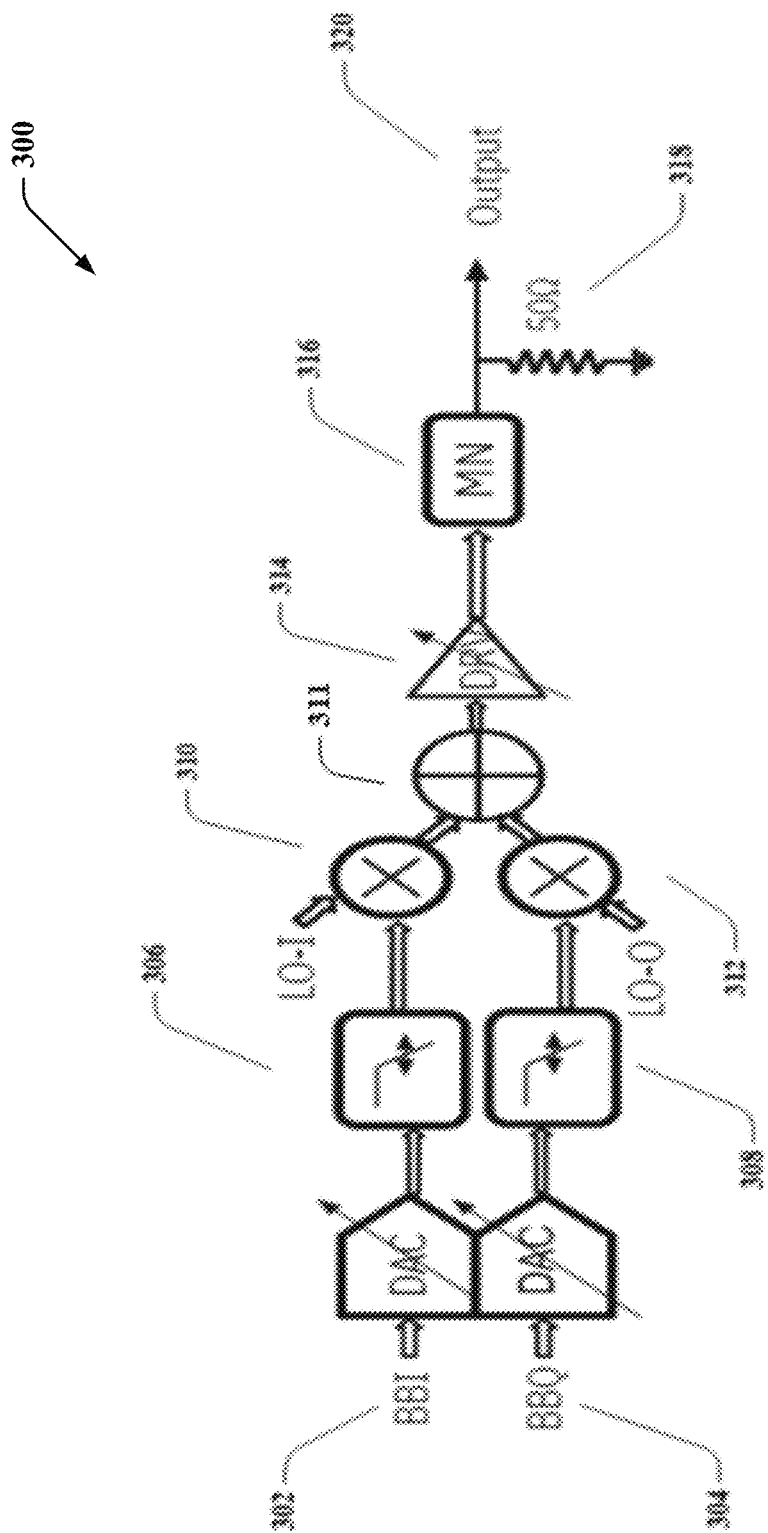
FIG. 3 illustrates an example architecture of a radio frequency digital to analog converter (RF DAC) signal chain.

FIG. 3 illustrates an example architecture of a radio frequency digital to analog converter (RFDAC) signal chain. One method to generate complex signals is to modulate a carrier signal frequency by a local oscillator using a vector modulator. In RF applications, baseband digital I and Q signals are generated using arbitrary waveform generators (AWG) which contain two or more synchronized digital to analog converters. An RFDAC chain architecture 300 has baseband digital BBI 302 and BBQ 304 signals. Multi-bit baseband digital to analog converters (DAC) 306 and 308 take digital bits and depending on bandwidth of a signal and sampling clock frequency, convert digital bits to an analog signal. This enables output of a current and provides a filtered and amplified current to mixers. Signals are processed through low pass filters 306 and 308 to reject an outer band noise component resulting from the digital to analog converter 300. The filtered signals are mixed and thus upconverted, by mixers 310 and 312, using two carriers (LO-Q and LO-I) having orthogonal phases 0 and 90 degrees for I and Q. Using a signal combiner 311, the resulting signals are combined by creating a single side band signal representation. For example, if (x*y) function needs to be performed in a single side band representation, then variable x can be represented as a combination of 0 and 90 degrees and variable y can be represented as a combination of 0 and 90 degrees. These two variables can then be multiplied and added, similar to the scalar product of two vectors. An output of this function is processed through a driver DRV 314. A matching network MN 316 is a component typically consisting of passive elements that do not provide distortions. The matching network 316 transfers resistance 318 (e.g., 50 ohms) to an impedance the driver requires, to maximize power transfer. An output 320 of these DACs is filtered, up-converted using I- and Q-channel mixers, and a resulting signal is combined and fed through a driver and matching network to a nominal load (e.g., 50 ohm) at output 320. The filter implementation and the interface between the filter and the other elements of the signal chain are of significance in such designs. Continuous-time filters are well suited for high dynamic range, low power active filter implementations. Current mode signal processing is well suited for low distortion applications, as it reduces voltage swings at various nodes of interest. However, a traditional current mode input filter using an operational amplifier consumes significant amount of power and has limitations in high frequency applications. Continuous time gm-C filters typically provide a high input impedance, which leads to higher distortion products. A gm-C type filter is well suited for high frequency applications but is quite limited in terms of dynamic range it supports as an input is typically a voltage.

Figure 4:
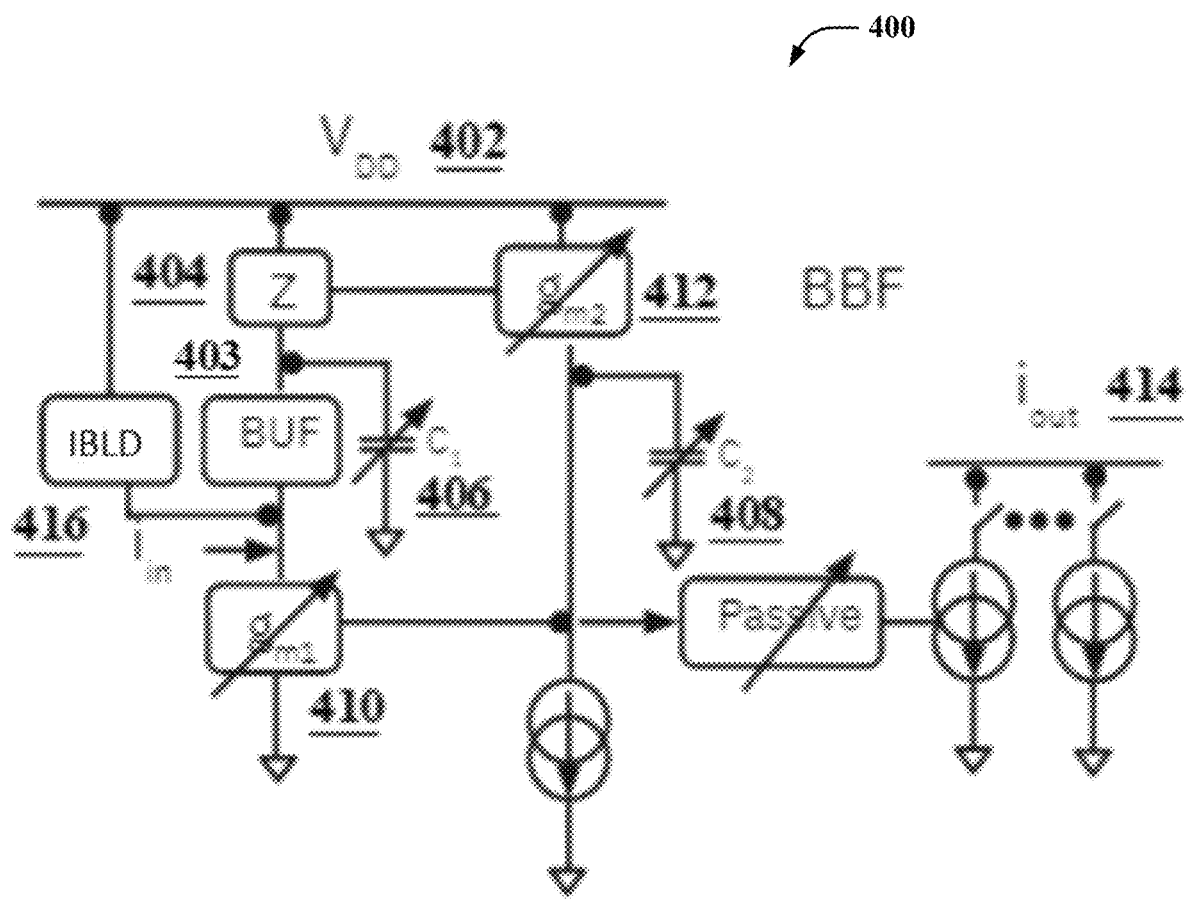
FIG. 4 illustrates an example block-level view architecture of the feedback based transconductance-capacitor baseband filter.

FIG. 4 illustrates an example block-level view architecture of a feedback based transconductance-capacitor baseband filter. Circuit architecture 400 has a DC power supply $V_{DD}$ 402. The circuit 400 consists of a buffer BUF 403 and a high impedance Z 404 that provides output impedance from the load transistors. There are two transconductance blocks $g_{m1}$ 410 and $g_{m2}$ 412. The two capacitance $C_1$ 406 and $C_2$ 408 with arrows show that $C_1$ and $C_2$ can be controlled together or independently. The ratio of the transconductances and the capacitors determine the quality factor of the filter. Current bleeder IBLD 416 is a current helper that provides different biasing such that the current taken by $g_{m1}$ 410 and the buffer BUF 403 can be different. A feedback loop would be the path through $g_{m2}$, Z, BUF, $g_{m1}$ and it employs the following equation:

$$Q = \sqrt{\frac{g_{m1} C_2}{g_{m2} C_1}}$$

wherein Q is quality factor and it is a ratio of similar quantities, nearly constant over Process (P), Temperature (T) variations. Q factor can be varied by programming $g_{m1}$, $g_{m2}$, $C_1$, $C_2$ using digital control. The feedback loop gain reduces distortion and bandwidth BW can be derived by employing the following equation:

$$BW = \frac{1}{2\Pi} \sqrt{\frac{g_{m1} g_{m2}}{C_1 C_2}}$$

A biasing strategy can be a sub-claim that optimizes performance wherein it biases from constant $g_m$ bias block and bias from 1/R bias (e.g., keeps filter poles tracking). A continuous-time baseband filter uses input current and provides an output current, and internal feedback mechanisms are carried out as a combination of current to voltage and voltage to current conversion. The feedback loop uses at least one high impedance node and at least one low impedance node, where the high impedance node provides a dominant pole, and the low impedance node provides a non-dominant pole. Pole splitting ensures stability, and biasing provides substantially constant separation between the dominant and the non-dominant poles to maintain adequate phase margin. The loop uses a mirroring device to mirror the filtered current to an output, and, by changing mirroring ratio, variable gain can be achieved to a fine baseline step. Coarse gain control can be achieved by scaling input current inside the feedback loop, and this auxiliary path can also be used as a path to monitor a scaled version of the input current without additional distortion. Additional poles can be placed between filter core stage and mirroring stage to achieve higher order filtering without compromising stability of the filter. This additional pole does not consume current and does not create distortion, and can be implemented using a resistor and capacitor. Output from this continuous time filter is a current, and multiple such filters can be easily cascaded to realize higher order current mode filters. A filter can provide low-pass, band-pass, or high-pass characteristics, with corner frequencies, quality factor, and gain steps set by digital control.

Figure 5:
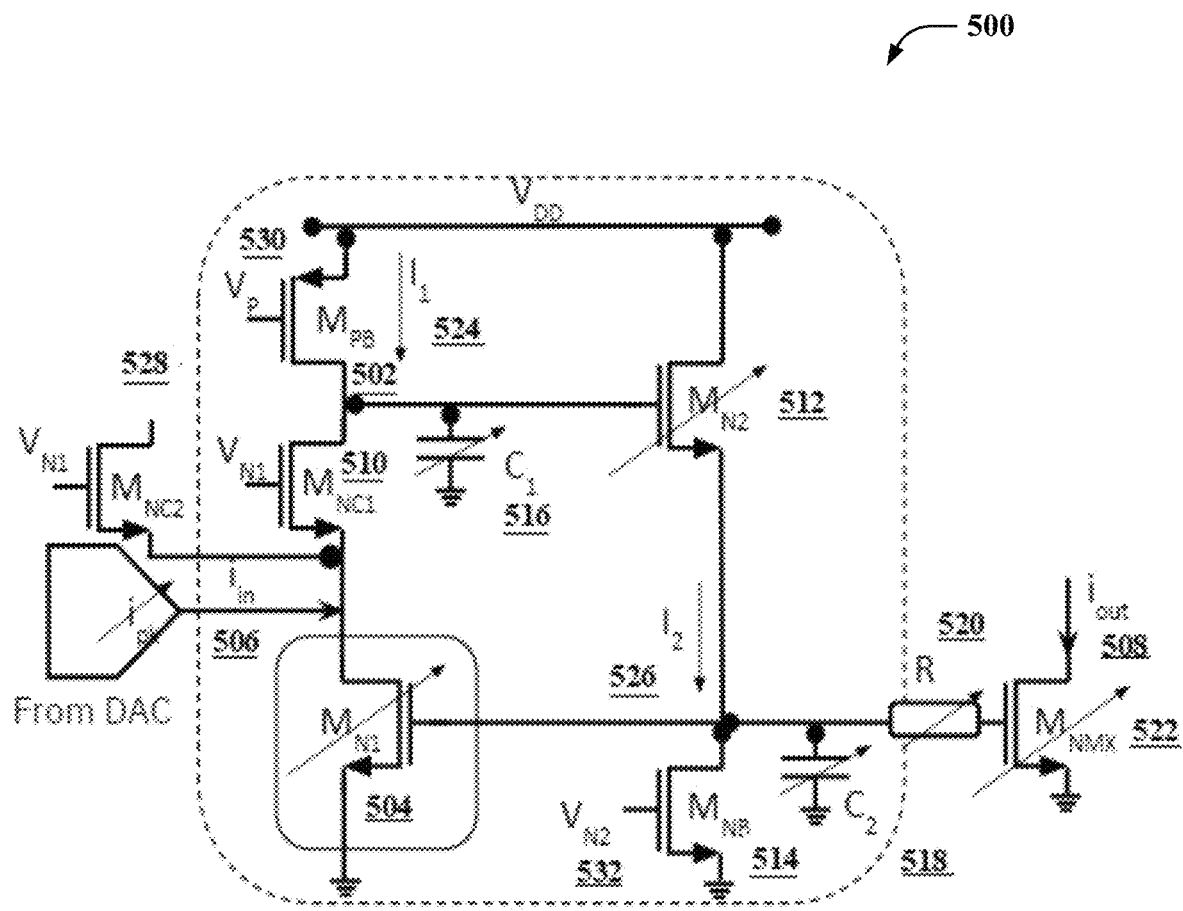
FIG. 5 illustrates an example schematic transistor level drawing of a single ended implementation of the filter.

FIG. 5 illustrates an example transistor level drawing of a single ended implementation of filter 500. The example embodiment is one of the construction methods of the filter. Transistors $M_{PB}$ 502 or $M_{N1}$ 504 can implement a DC offset compensation DAC. The filter 500 has a current mode input/output gm-C filter. A common mode of the input current 506 is set and the output current 508 is programmed via $M_{NMX}$ using drain/gate/source switching elements. This is a negative feedback loop that consists of $M_{NC1}$ 510 and $M_{N2}$ 512 then $M_{N1}$ 504 wherein the three transistors are inside the loop. The other two transistors $M_{PB}$ 502 and $M_{NB}$ 514 are PMOS and NMOS bias transistors respectively. The baseband filter has a current mode input along with a negative feedback loop. The feedback loop consists of two capacitors $C_1$ 516 and $C_2$ 518. $C_1$ 516 is associated with the dominant pole which is where node $C_1$ is connected and $C_2$ 518 is associated with a non-dominant pole. The feedback loop is connected to one dominant pole and one non-dominant pole. In this way, it provides room to optimize for phase margin and stability purposes. The dominant pole is formed by output conductance of transistors and the non-dominant pole is formed by transconductance of transistors. The third pole is with resistance R 520 and an input capacitance of device $M_{NMX}$ 522. This provides three poles and the third pole can be realized without any additional consumption of current. The output is also a current $i_{out}$ 508 and it provides a filtering function and a gain function wherein gain is denoted by $i_{out}/i_{in}$. This filter 500 provides simultaneously the possibility of a lowpass or bandpass transfer function. By using current waveforms associated with $i_{out}/i_{in}$, a transfer function can be derived wherein it is a low pass response. Else, the transfer function of the current can be derived by $i(M_{NC1})/i_{in}$, wherein it would be a bandpass response. Thus, this filter 500 provides both responses simultaneously; it has two poles which are complex conjugates of one another and a real pole that is formed outside the loop is given by resistance and input capacitance of $M_{NMX}$. $I_1$ 524 and $I_2$ 526 which are digitally programmable using current mirrors via $V_P$ 530 and $V_{N2}$ 532 nets. $M_{NC2}$ 528 is used as an attenuator to handle input dynamic range. This is one representation of an example structure. If NMOS is turned into PMOS, then that could be another example representation.

Figure 6:
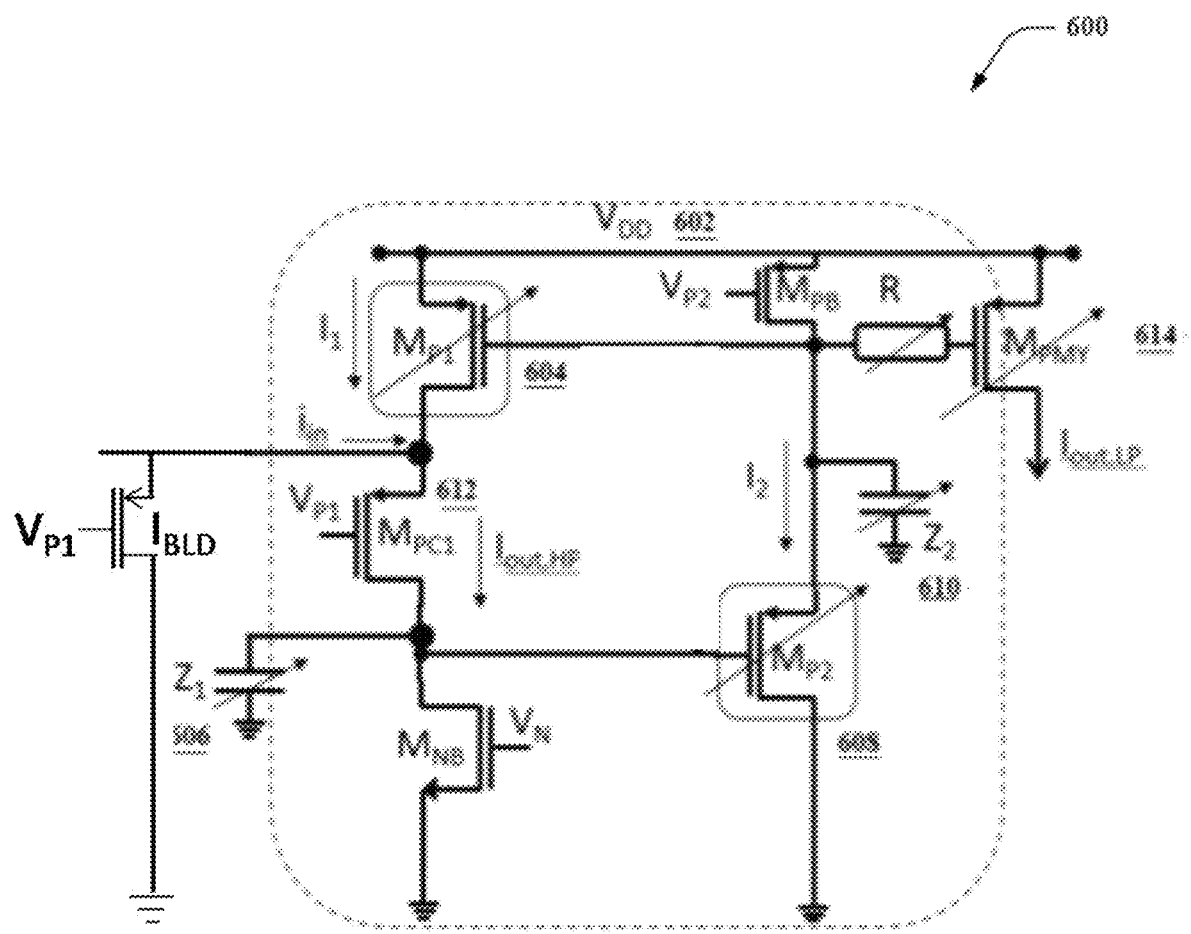
FIG. 6 illustrates an example schematic transistor level implementation of the baseband filter.

FIG. 6 illustrates another example transistor level drawing of a single ended implementation of a filter architecture 600 that has a DC power supply $V_{DD}$ 602. The filter 600 consists of two transistors $M_{P1}$ 604 and $M_{P2}$ 608. $Z_1$ 606 and $Z_2$ 610 represent capacitors associated with dominant pole and non-dominant poles. $Z_1$ 606 and $Z_2$ 610 can be represented using series and parallel combination of at least one reactive element (e.g., capacitance, inductance). This feedback loop consists of transistors $M_{PC1}$ 612, $M_{P2}$ 604, $M_{P1}$ 608 that provide negative feedback using current mode signaling. A transfer function of variables of low pass and high pass filter $H_{LP}$ and $H_{HP}$ can be represented by:

$$H_{LP}(s) = \frac{i_{out,LP}}{i_{in}} = \frac{-\alpha\left(\frac{g_{m1}g_{m2}}{C_1 C_2}\right)}{\left\{s^2 + s\left(\frac{g_{m2}}{C_2}\right) + \left(\frac{g_{m1}g_{m2}}{C_1 C_2}\right)\right\}}$$

$$H_{HP}(s) = \frac{i_{out,HP}}{i_{in}} = \frac{s^2 + s\left(\frac{g_{m2}}{C_2}\right)}{\left\{s^2 + s\left(\frac{g_{m2}}{C_2}\right) + \left(\frac{g_{m1}g_{m2}}{C_1 C_2}\right)\right\}}$$

wherein $g_{m1}$ and $g_{m2}$ represent transconductances of transistors $M_{P1}$ 604 and $M_{P2}$ 608. $I_{in}$, $i_{out}$ represent input and output current and capacitance is represented as $C_1$ and $C_2$. HP and LP represent low-pass and high-pass filters. $\alpha$ represents ratio between the two transistors $M_{PMY}$ 614 and $M_{P1}$ 604, respectively. Poles are formed by a ratio of $G_m$ transconductance and capacitance, and a bias can be provided such that $G_m$ can be constant where $G_m$ and C can be calibrated independently or can also be biased wherein it tracks $G_m/C$ by itself. The biasing along with the filter 600 holds a unique place as well. The transistors $M_{PMY}$ 614 and $M_{P1}$ 604 can be biased in sub-threshold or in strong impulsion wherein one transistor can be sub-threshold and the other transistor can obtain strong impulsion. Similar permutation and combinations can be made with the transistors as described in the example above.

Figure 7:
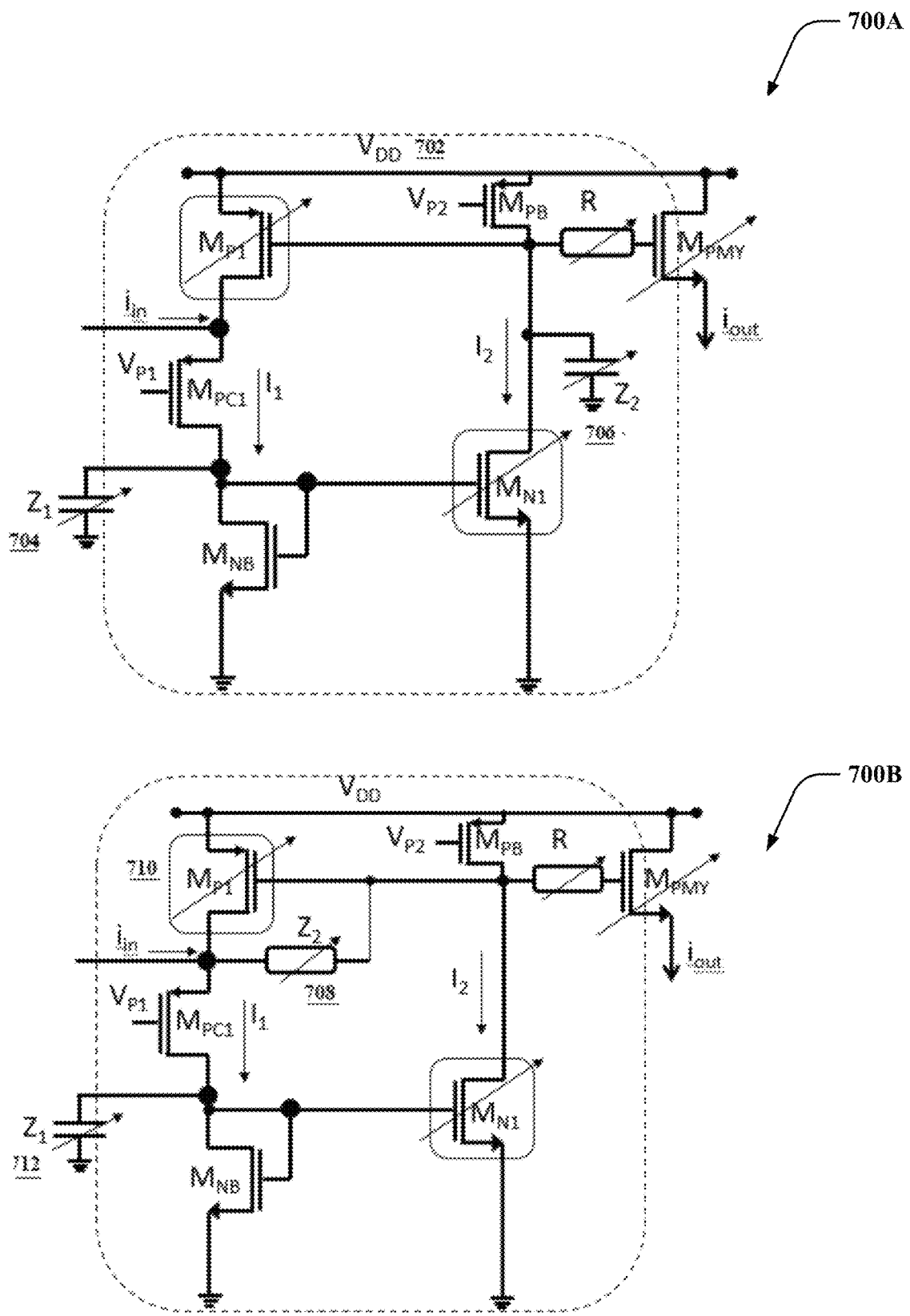
FIG. 7 illustrates another example transistor level drawing of an alternate filter arrangement of embodiments.

FIG. 7 illustrates another example transistor level drawing of an alternate filter arrangement of embodiments. There are many implementation combinations of the baseband filter and these embodiments propose one of such implementation methods. As shown in the illustration 700A, $g_m$ represents the transconductance of the transistor and C represents the capacitor. The architecture 700A has a DC power supply $V_{DD}$ 702. In this configuration, impedance $Z_2$ 706 is associated with the dominant pole, and $Z_1$ 704 is associated with the non-dominant pole. Also, this configuration uses positive feedback using current mode signaling. Another example of embodiment is shown in the illustration 700B. In this configuration, the impedance $Z_2$ 708 is coupled between the gate and the drain terminals of $M_{P1}$ 710. This leads to a smaller size pole and $Z_1$ 712 is associated with the non-dominant pole. This configuration also uses positive feedback using current mode signaling.

Figure 8:
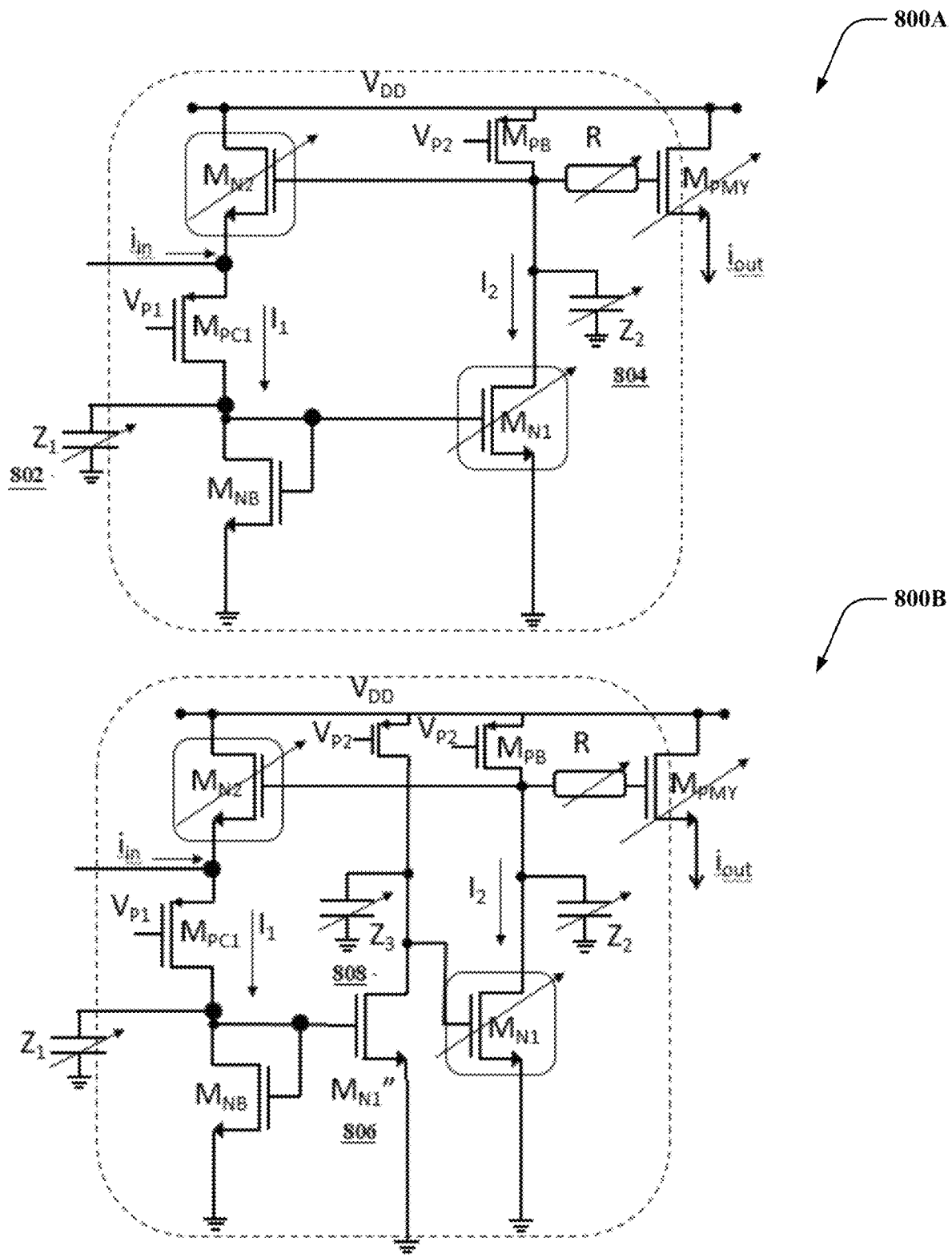
FIG. 8 illustrates another example transistor level drawing of an alternate filter arrangement of an embodiment.

FIG. 8 illustrates another example transistor level drawing of an alternate filter arrangement of a sample embodiment. There are many implementation combinations of the baseband filter and these embodiments propose one of such implementation methods. As shown in the illustration 800A, the impedance $Z_2$ 804 is associated with the dominant pole and $Z_1$ 802 is associated with the non-dominant pole. This configuration uses negative feedback using current mode signaling. Similarly, the architecture shown in 800B illustrates that additional current mode signaling leg is introduced within the feedback loop ($M_{N1}$" 806 and $Z_3$ 808). Depending on the signal scaling and polarity, the filter order can be increased.

Figure 9:
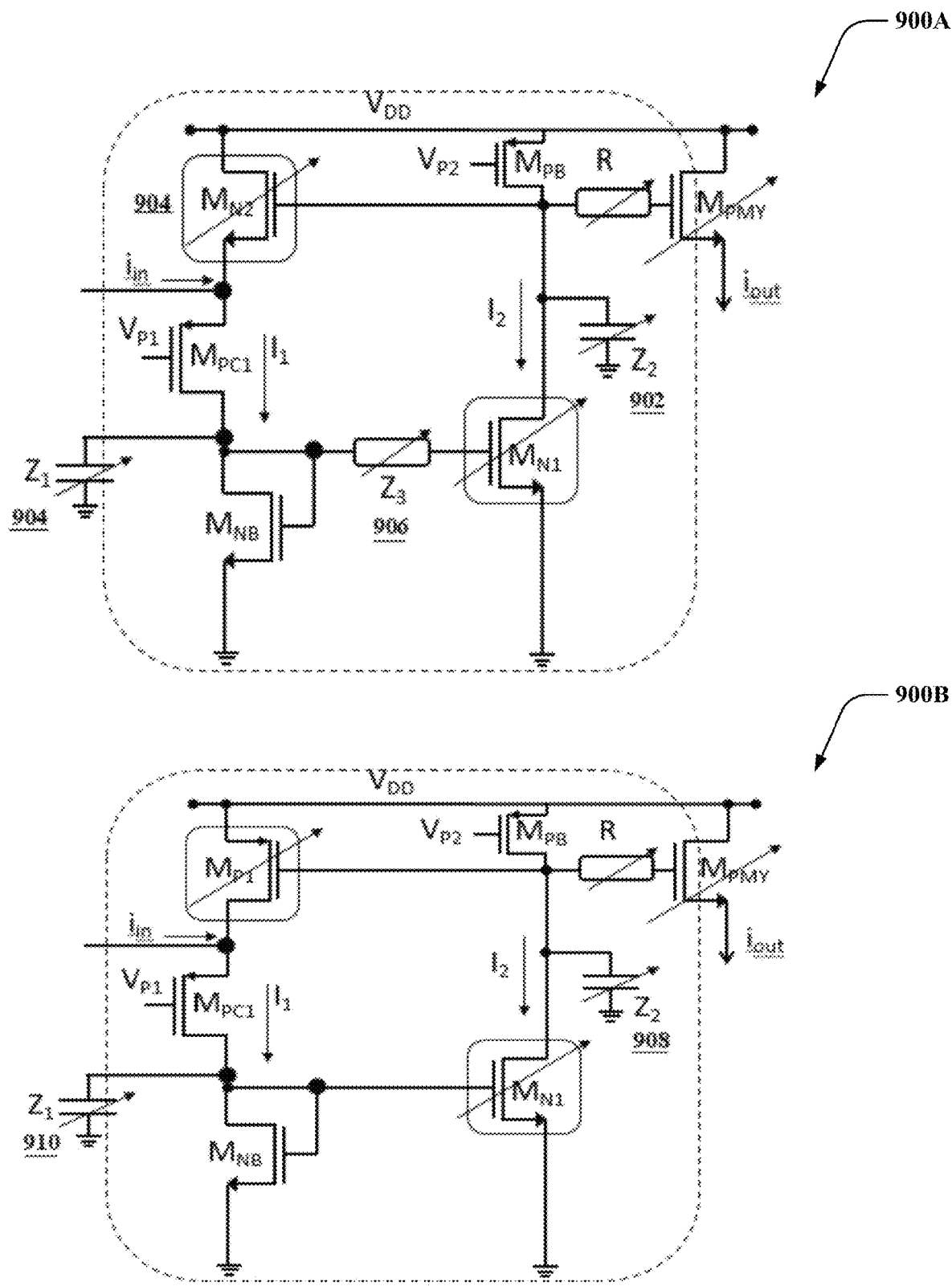
FIG. 9 illustrates another example transistor level drawing of an alternate filter arrangement of embodiments.

FIG. 9 illustrates another example transistor level drawing of an alternate filter arrangement of embodiments. There are many implementation combinations of the baseband filter and these embodiments propose one of such implementation methods. As shown in the illustration 900A, this configuration has impedance $Z_2$ 902 which is associated with the dominant pole and $Z_1$ 904 is associated with the non-dominant pole. This configuration uses negative feedback using current mode signaling. The impedance $Z_3$ 906 is inserted within the loop to achieve higher order filtering and consists of at least one passive element and $Z_3$ 906 can be placed at the gate of $M_{N2}$ 904. Similarly, the illustration shown in 900B has additional impedances wherein impedance $Z_2$ 908 is associated with the dominant pole and $Z_1$ 910 is associated with the non-dominant pole. This configuration uses positive feedback using current mode signaling.

Figure 10:
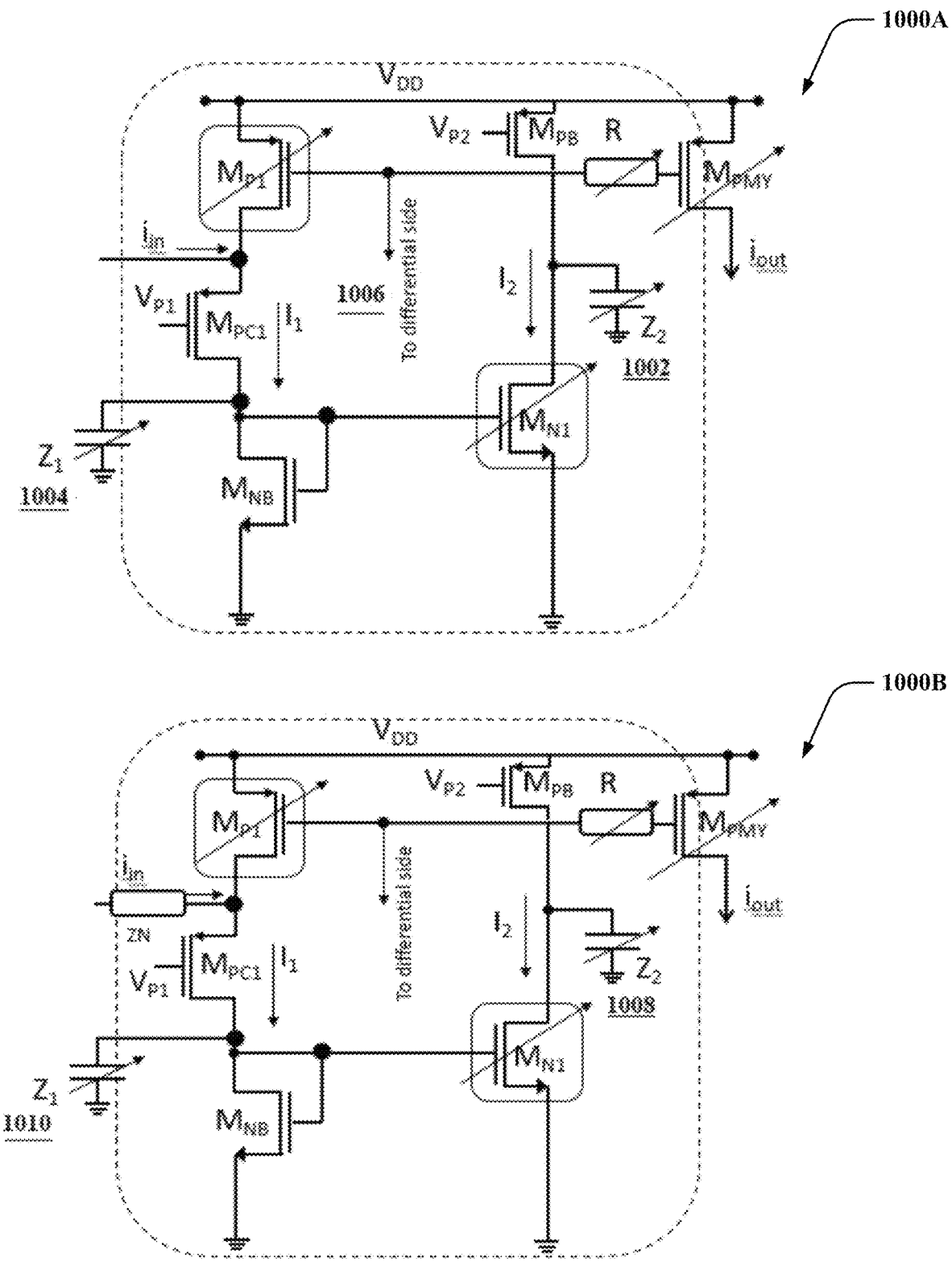
FIG. 10 illustrates an example transistor level drawing of a differential filter transfer function of an embodiment.

FIG. 10 illustrates an example transistor level drawing of a differential filter transfer function of a sample embodiment. There are many implementation combinations of the baseband filter and these embodiments propose one of such implementation methods. As shown in the illustration 1000A, this configuration has impedance $Z_2$ 1002 is associated with the dominant pole and $Z_1$ 1004 is associated with the non-dominant pole. This schematic diagram is a differential filter wherein the transistors are transferred to the differential side 1006. In addition, the illustration shown in 1000B is configured wherein impedance $Z_2$ 1008 is associated with the dominant pole and $Z_1$ 1010 is associated with the non-dominant pole. The additional series impedance at the input terminal leads to neutralization and can reduce the loading to the driving circuit. A neutralization network consists of at least one passive element.

A novelty of these embodiments is to use a current mode gm-C continuous time filter. This methodology can realize two poles inside a feedback loop. The feedback loop can realize a complex pair of poles. The feedback provides linearization leading to low distortion. A real pole is realized outside the loop. Moreover, the variable gain is implemented by using a plurality of current mirroring elements, and M out of N elements are enabled to implement the desired output current. The current can be shared between the mixer and the baseband filter output stage which reduces power. Three poles can be realized while incurring distortion of only one trans conductor stage. This concept can be extended by a seamless cascade of multiple current mode filter with common mode compatibility. The input stage can be shared with the previous stage output to further reduce power consumption. The output stage can be shared with the next stage input to further reduce power consumption. Complex filter implementation can be realized using delayed signals from I and Q.

Figure 11:
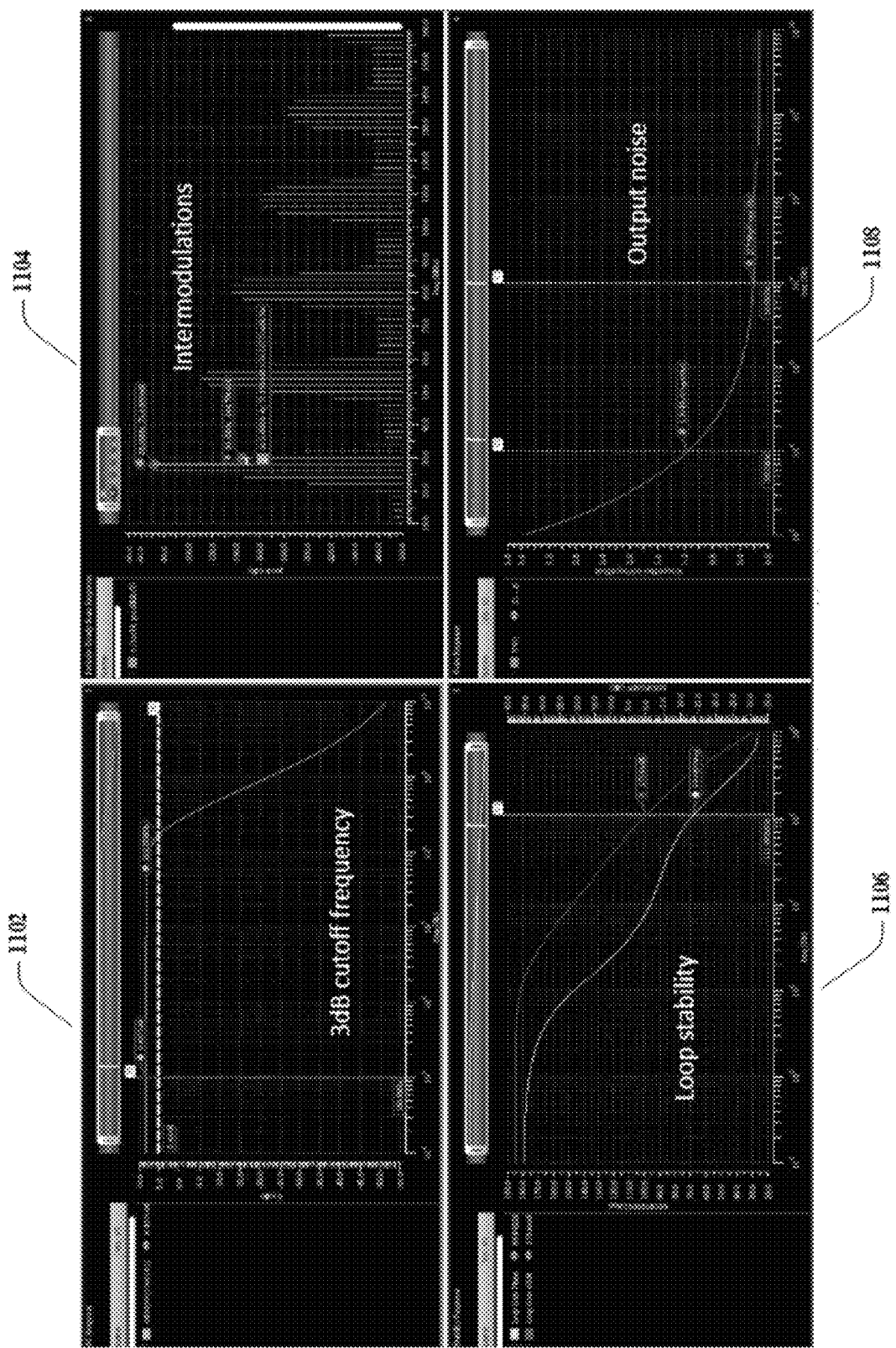
FIG. 11 illustrates an example of simulation results of the current mode transconductance-capacitance filter.

FIG. 11 illustrates an example of simulation results of the current mode transconductance-capacitance filter. The simulation shows the frequency response 1102 at 3 dB cut-off frequency. The intermodulation results 1104 show the results that vary based on the frequency spectrum on the x-axis. The loop stability based on the varying frequency spectrum 1106 and the resulting output noise of this baseband filter 1108. These simulations determine that this type of current mode baseband filter is necessary for the overall requirement of the right controller block in the quantum application. This can also be used in a generic sense for any transmitter such as a radio transmitter. The output results and intermodulation results show that this filter provides a path to current reuse between the filter and any adjacent stages in the signal chain. It avoids introducing additional current-voltage conversions in the signal path which helps limit undesirable distortion products. It also aligns well with low output amplitude requirements.

Figure 12:
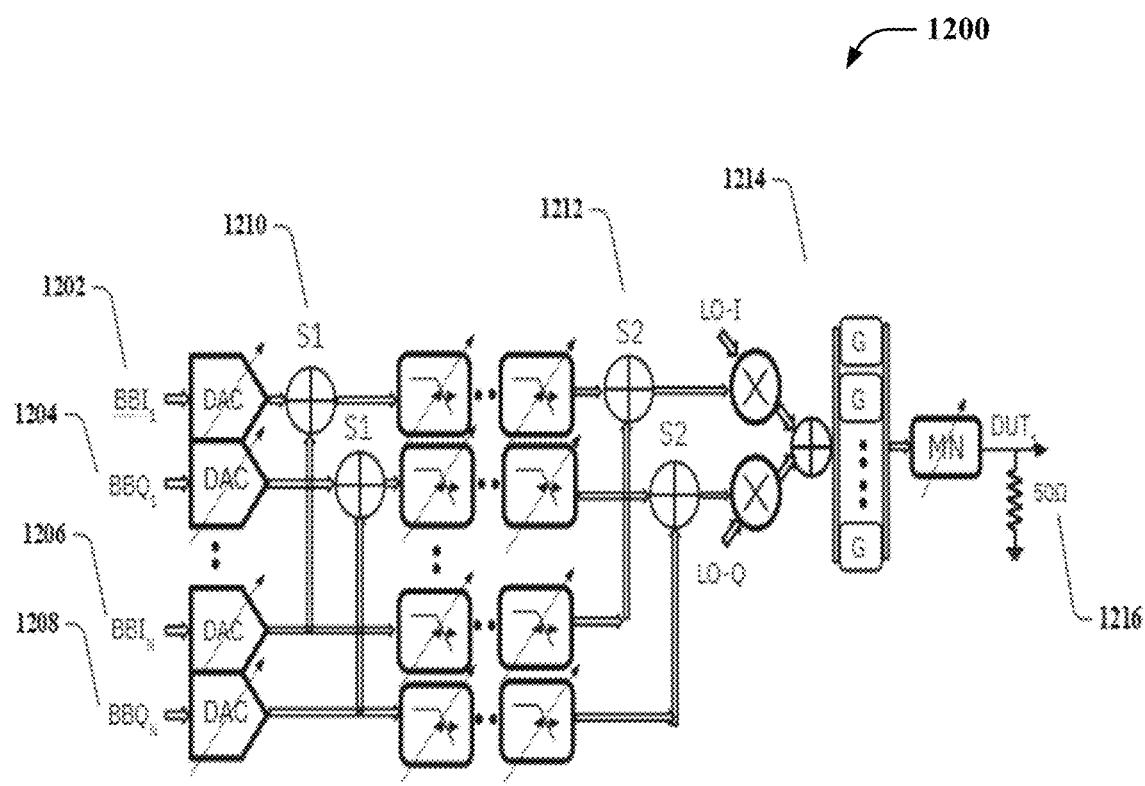
FIG. 12 illustrates an example of schematic extension of an array-based system.

FIG. 12 illustrates an example of schematic extension of an array-based system. As shown in the illustration 1200, the input is fed with baseband signals I and Q represented as $BBI_1$ 1202 and $BBQ_1$ 1204. This can also be extended to n signals $BBI_N$ 1206 and $BBQ_N$ 1208. In this flow, the filter element is shared among multiple channels. With input and output as current, the current is taken from one filter to another filter 1210 and 1212. Addition or subtraction 1214 can also be performed with any of these interfaces in the simplest way to produce an output 1216 with 50-ohm resistance. Another set of applications can also be performed wherein one filter in an array, one filter in a low pass construct and another filter with a band pass response can be used. Through this way, it provides different types of signals to different sensors or qubits. Higher order filtering can be realized by cascading a plurality of filters with common mode compatibility. Also, low distortion polyphase filtering can be implemented by cross-coupling quadrature phase filters.

Figure 13:
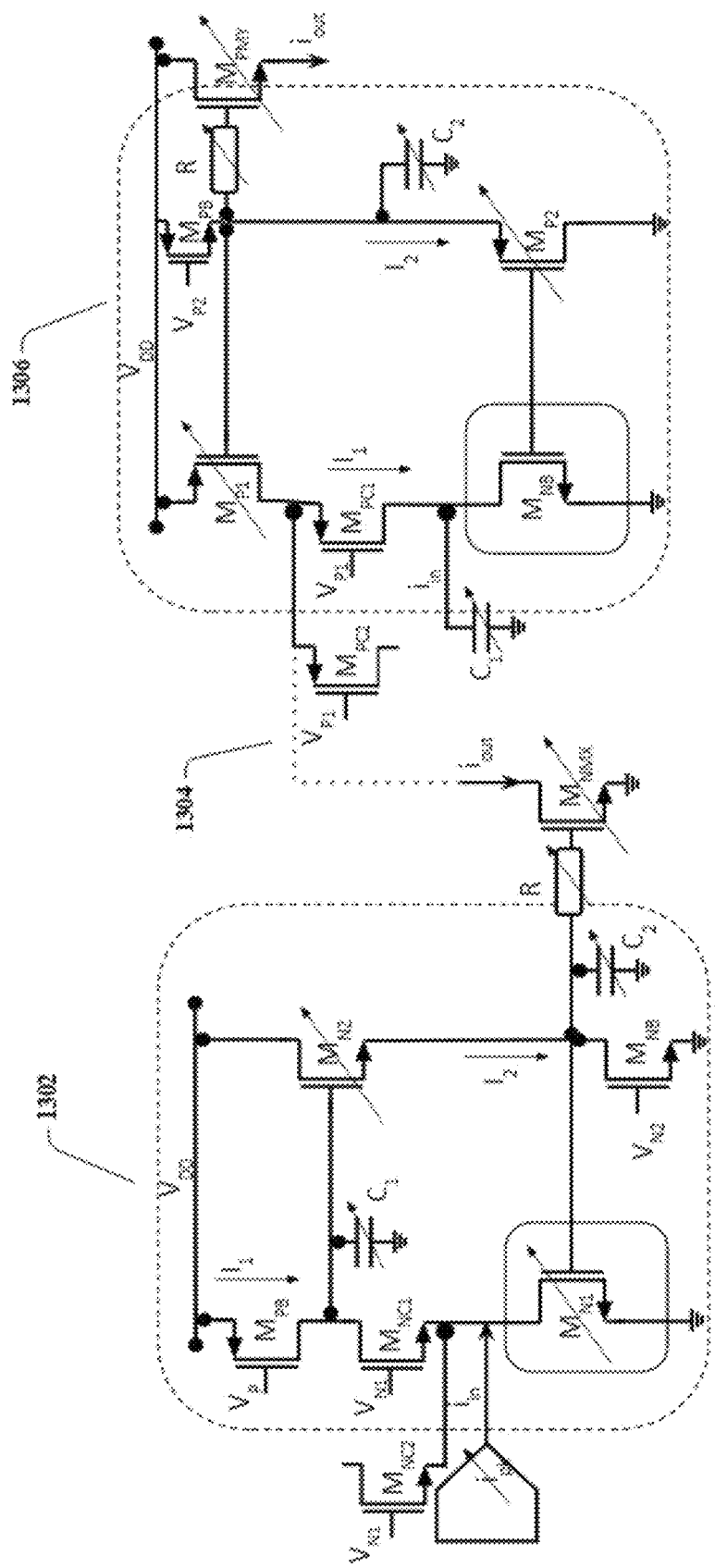
FIG. 13 illustrates an example schematic of a cascaded extension of complementary stages.

FIG. 13 illustrates an example schematic of a cascaded extension of complementary stages. The illustration in block 1300 shows how cascades can be made wherein the filter 1302 is a $3^{rd}$ order filter but it can only consume current for $2^{nd}$ order filter. This can cause it to be in a loop. The output of an NMOS stage is directly coupled 1304 to the input of a PMOS stage 1306. The filter shown in this illustration is a $3^{rd}$ order filter and the cascade is $6^{th}$ order resulting in using minimum power consumption and low distortion. This illustration is shown in a single-phase system, but loop construction can be made differential as well. The filter 1306 is also a $3^{rd}$ order filter and two similar filters can be used to construct high order filter without any loss of the dynamic range and thus it makes it simple to cascade these two filters. In the prior embodiments, the OTA based transimpedance filter was commonly used in wireless systems. This filter typically uses shunt-shunt feedback however the gain-bandwidth requirements lead to high power consumption. Both low and band-pass transfer function can be realized. This proposed structure can work with only one high impedance node in the feedback loop for a biquadratic function. It is compact due to a lack of resistor. The open loop cascade structure with common gate input is used in some cases and typically with a current to voltage converter. This proposed structure uses feedback to realize two complex poles thereby leading to two real poles. This has limited the reliability of the filter transfer function.

The current mode solution offers a path to reuse current and low distortion that is well-tuned to the requirements of cryogenic waveform generation. A novelty of these embodiments is in the use of the transconductance-capacitor filter (gm-C). The main contribution is the realization of a gm-C filter that provides low input impedance. The traditional gm-C filters have high input impedance and typically provide input voltage to output voltage transfer function. The implementation in commercially available CMOS technologies is entirely feasible. This circuit approach is valuable for implementing CMOS control pulse generation analog circuits to enable enhanced scalability of future quantum computing systems.

Figure 14:
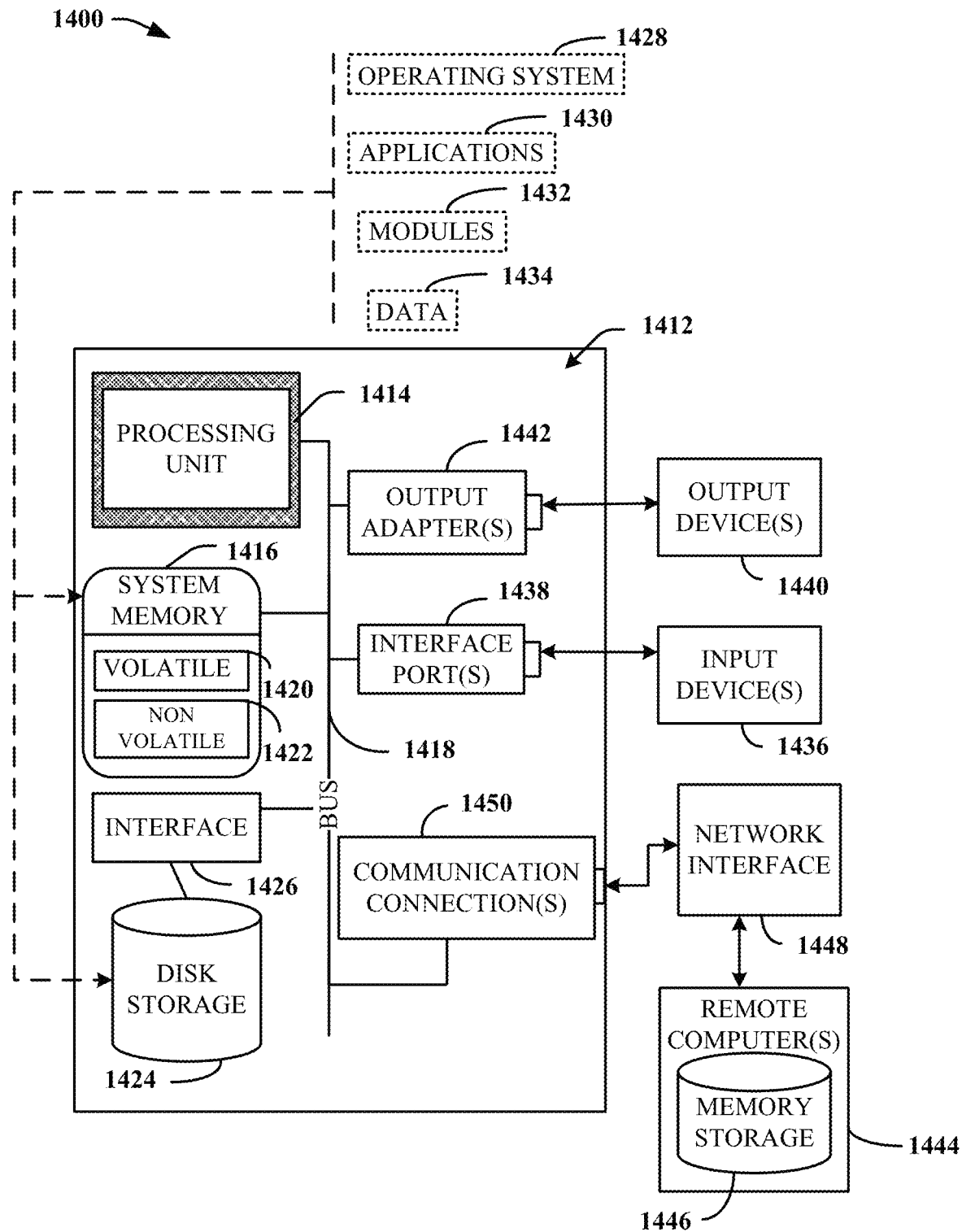
FIG. 14 illustrates a block diagram of an example, non-limiting, operating environment in which one or more embodiments described herein can be facilitated.

To provide a context for the various aspects of the disclosed subject matter, FIG. 14 as well as the following discussion are intended to provide a general description of a suitable environment in which the various aspects of the disclosed subject matter can be implemented. FIG. 14 illustrates a block diagram of an example, non-limiting operating environment in which one or more embodiments described herein can be facilitated. Repetitive description of like elements employed in other embodiments described herein is omitted for sake of brevity.

With reference to FIG. 14, a suitable operating environment 1400 for implementing various aspects of this disclosure can also include a computer 1412. The computer 1412 can also include a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414. The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Firewire (IEEE 1394), and Small Computer Systems Interface (SCSI).

The system memory 1416 can also include volatile memory 1420 and non-volatile memory 1422. The basic input/output system (BIOS), containing the basic routines to transfer information between elements within the computer 1412, such as during start-up, is stored in non-volatile memory 1422. Computer 1412 can also include removable/non-removable, volatile/non-volatile computer storage media. FIG. 14 illustrates, for example, a disk storage 1424. Disk storage 1424 can also include, but is not limited to, devices like a magnetic disk drive, floppy disk drive, tape drive, Jaz drive, Zip drive, LS-100 drive, flash memory card, or memory stick. The disk storage 1424 also can include storage media separately or in combination with other storage media. To facilitate connection of the disk storage 1424 to the system bus 1418, a removable or non-removable interface is typically used, such as interface 1426. FIG. 14 also depicts software that acts as an intermediary between users and the basic computer resources described in the suitable operating environment 1400. Such software can also include, for example, an operating system 1428. Operating system 1428, which can be stored on disk storage 1424, acts to control and allocate resources of the computer 1412.

System applications 1430 take advantage of the management of resources by operating system 1428 through program modules 1432 and program data 1434, e.g., stored either in system memory 1416 or on disk storage 1424. It is to be appreciated that this disclosure can be implemented with various operating systems or combinations of operating systems. A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port can be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It is to be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a computer, a server, a router, a network PC, a workstation, a microprocessor based appliance, a peer device or other common network node and the like, and typically can also include many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL). Communication connection(s) 1450 refers to the hardware/software employed to connect the network interface 1448 to the system bus 1418. While communication connection 1450 is shown for illustrative clarity inside computer 1412, it can also be external to computer 1412. The hardware/software for connection to the network interface 1448 can also include, for exemplary purposes only, internal and external technologies such as, modems including regular telephone grade modems, cable modems and DSL modems, ISDN adapters, and Ethernet cards.

Figure 15:
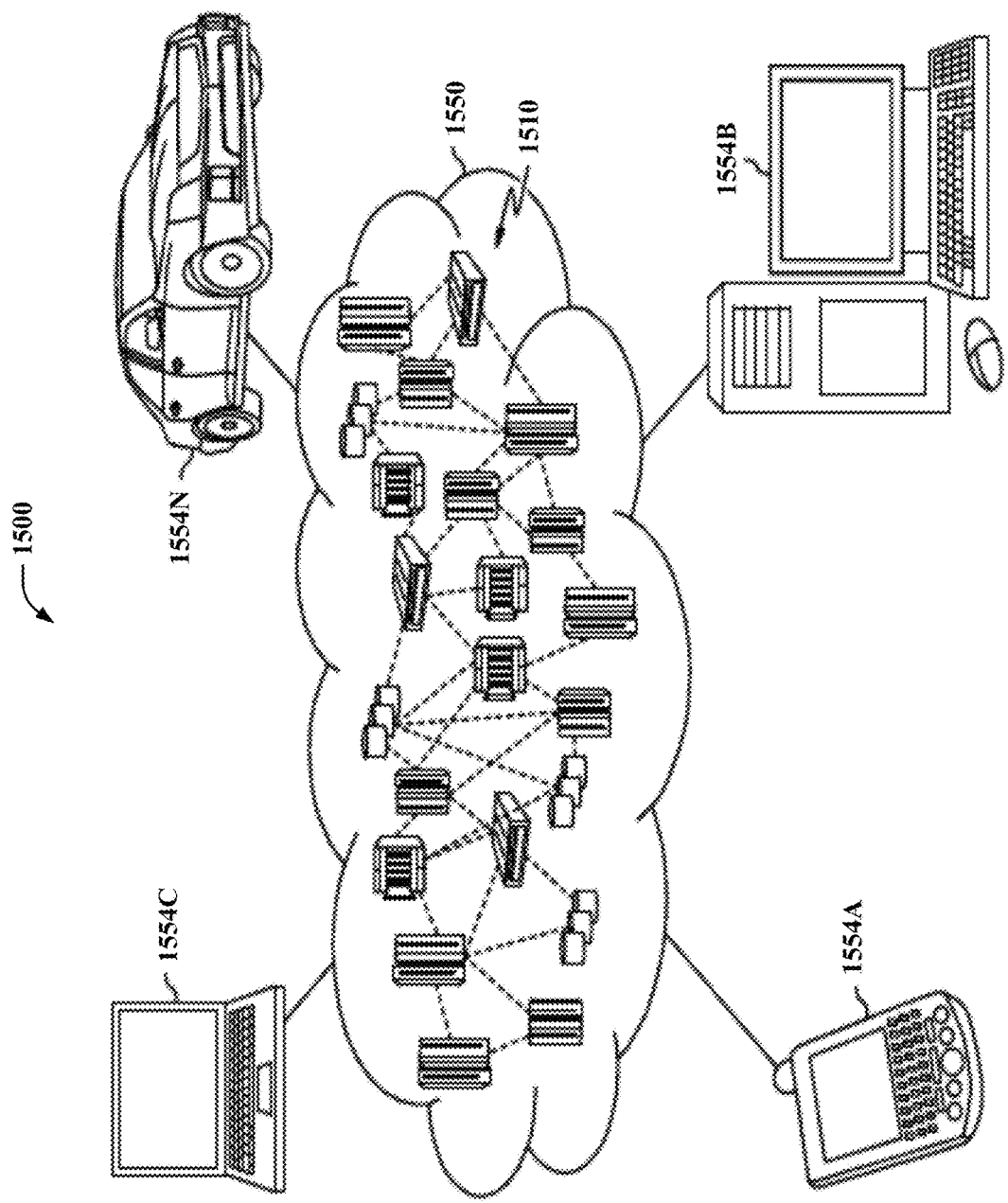
FIG. 15 illustrates a block diagram of an example, non-limiting, cloud computing environment in accordance with one or more embodiments of the subject disclosure.

Referring now to FIG. 15, an illustrative cloud computing environment 1550 is depicted. As shown, cloud computing environment 1550 includes one or more cloud computing nodes 1510 with which local computing devices used by cloud consumers, such as, for example, personal digital assistant (PDA) or cellular telephone 1554A, desktop computer 1554B, laptop computer 1554C, and/or automobile computer system 1554N may communicate. Although not illustrated in FIG. 15, cloud computing nodes 1510 can further comprise a quantum platform (e.g., quantum computer, quantum hardware, quantum software, etc.) with which local computing devices used by cloud consumers can communicate. Nodes 1510 may communicate with one another. It may be grouped (not shown) physically or virtually, in one or more networks, such as Private, Community, Public, or Hybrid clouds as described hereinabove, or a combination thereof. This allows cloud computing environment 1550 to offer infrastructure, platforms and/or software as services for which a cloud consumer does not need to maintain resources on a local computing device. It is understood that the types of computing devices 1554A-N shown in FIG. 15 are intended to be illustrative only and that computing nodes 1510 and cloud computing environment 1550 can communicate with any type of computerized device over any type of network and/or network addressable connection (e.g., using a web browser).

Figure 16:
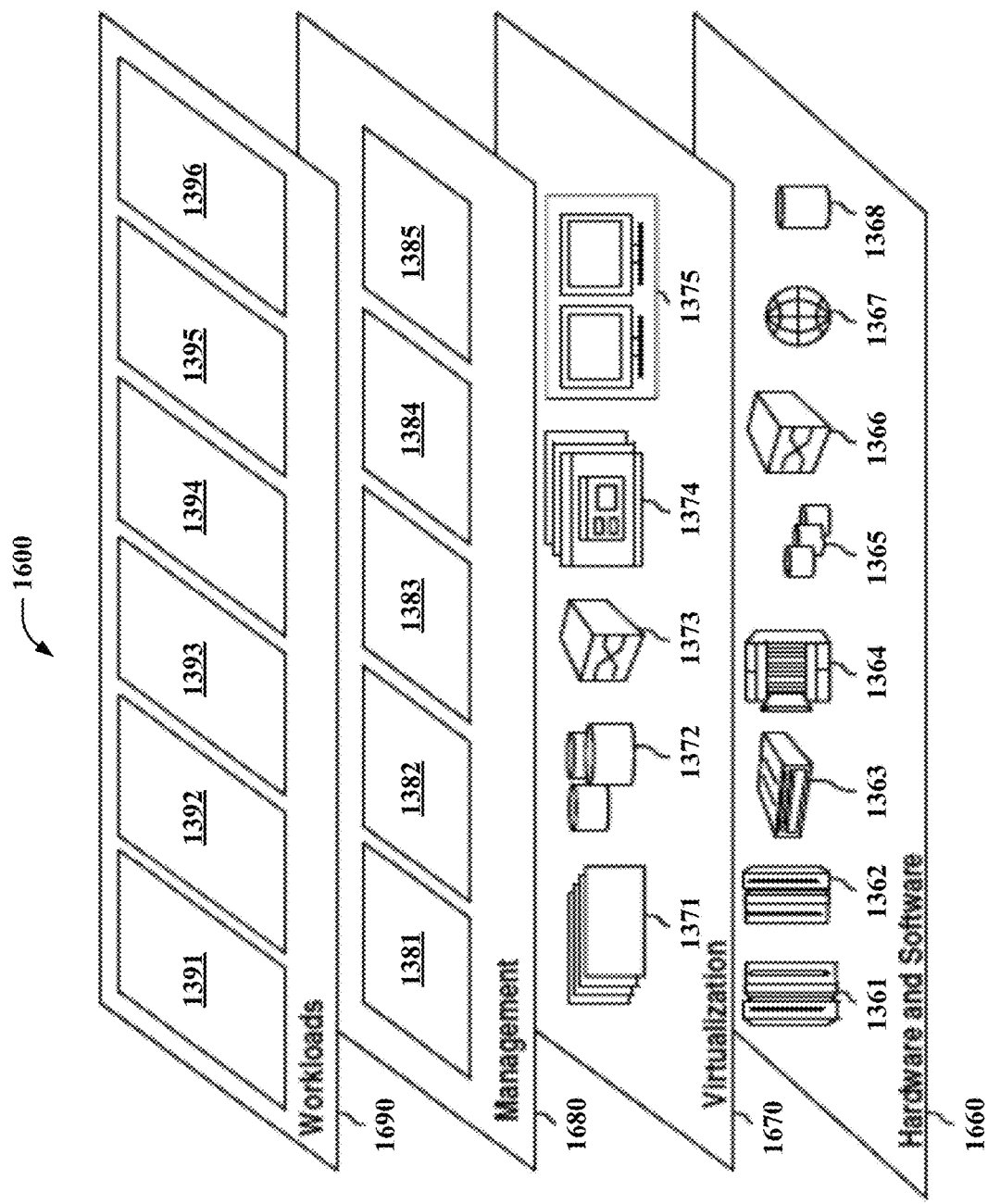
FIG. 16 illustrates a block diagram of example, non-limiting, abstraction model layers in accordance with one or more embodiments of the subject disclosure.

Referring now to FIG. 16, a set of functional abstraction layers provided by cloud computing environment 1550 (FIG. 15) is shown. It should be understood in advance that the components, layers, and functions shown in FIG. 16 are intended to be illustrative only and embodiments of the invention are not limited thereto. As depicted, the following layers and corresponding functions are provided:

Hardware and software layer 1660 includes hardware and software components. Examples of hardware components include: mainframes 1661; RISC (Reduced Instruction Set Computer) architecture-based servers 1662; servers 1663; blade servers 1664; storage devices 1665; and networks and networking components 1666. In some embodiments, software components include network application server software 1667, quantum platform routing software 1668, and/or quantum software (not illustrated in FIG. 16).

Virtualization layer 1670 provides an abstraction layer from which the following examples of virtual entities may be provided: virtual servers 1671; virtual storage 1672; virtual networks 1673, including virtual private networks; virtual applications and operating systems 1674; and virtual clients 1675.

In one example, management layer 1680 may provide the functions described below. Resource provisioning 1681 provides dynamic procurement of computing resources and other resources that are utilized to perform tasks within the cloud computing environment. Metering and Pricing 1682 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1683 provides access to the cloud computing environment for consumers and system administrators. Service level management 1684 provides cloud computing resource allocation and management such that required service levels are met. Service Level Agreement (SLA) planning and fulfillment 1685 provide pre-arrangement for, and procurement of, cloud computing resources for which a future requirement is anticipated in accordance with an SLA.

Workloads layer 1690 provides examples of functionality for which the cloud computing environment may be utilized. Non-limiting examples of workloads and functions which may be provided from this layer include: mapping and navigation 1691; software development and lifecycle management 1692; virtual classroom education delivery 1693; data analytics processing 1694; transaction processing 1695; and quantum state preparation software 1696.

The present invention may be a system, a method, an apparatus and/or a computer program product at any possible technical detail level of integration. The computer program product can include a computer readable storage medium (or media) having computer readable program instructions thereon for causing a processor to carry out aspects of the present invention. The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium can also include the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can comprise copper transmission cables, optical transmission fibers, wireless transmission, routers, firewalls, switches, gateway computers and/or edge servers. A network adapter card or network interface in computing/processing device receives computer readable program instructions from the network and forwards the computer readable program instructions for storage in a computer readable storage medium within the respective computing/processing device. Computer readable program instructions for carrying out operations of the present invention can be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It can be understood that each block of the flowchart illustrations and/or block diagrams, and combinations of blocks in the flowchart illustrations and/or block diagrams, can be implemented by computer readable program instructions. These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks. The computer readable program instructions can also be loaded onto a computer, other programmable data processing apparatus, or other device to cause a series of operational acts to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It can also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the subject matter has been described above in the general context of computer-executable instructions of a computer program product that runs on a computer and/or computers, those skilled in the art will recognize that this disclosure also can or can be implemented in combination with other program modules. Generally, program modules include routines, programs, components, data structures, etc. that perform particular tasks and/or implement particular abstract data types. Moreover, those skilled in the art will appreciate that the inventive computer-implemented methods can be practiced with other computer system configurations, including single-processor or multiprocessor computer systems, mini-computing devices, mainframe computers, as well as computers, hand-held computing devices (e.g., PDA, phone), microprocessor-based or programmable consumer or industrial electronics, and the like. The illustrated aspects can also be practiced in distributed computing environments in which tasks are performed by remote processing devices that are linked through a communications network. However, some, if not all aspects of this disclosure can be practiced on stand-alone computers. In a distributed computing environment, program modules can be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor can also be implemented as a combination of computing processing units. In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or non-volatile memory, or can include both volatile and non-volatile memory. By way of illustration, and not limitation, non-volatile memory can include read only memory (ROM), programmable ROM (PROM), electrically programmable ROM (EPROM), electrically erasable ROM (EEPROM), flash memory, or non-volatile random-access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DR-RAM), direct Rambus dynamic RAM (DRDRAM), and Rambus dynamic RAM (RDRAM). Additionally, the disclosed memory components of systems or computer-implemented methods herein are intended to include, without being limited to including, these and any other suitable types of memory.

What has been described above include mere examples of systems and computer-implemented methods. It is, of course, not possible to describe every conceivable combination of components or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A filter stage system, comprising:
a continuous time baseband filter that comprises a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole, wherein the feedback loop comprises the at least one first impedance node, the at least one second impedance node, a buffer, a first transconductance block, and a second transconductance block, and wherein the continuous time baseband filter generates a filtered current; and
a mirroring component that mirrors the filtered current to an output.

2. The filter stage system of claim 1, wherein the mirroring component selectively changes a mirroring ratio to achieve a variable gain.

3. The filter stage system of claim 1, further comprising a scaling component that scales an input current of the feedback loop to facilitate coarse gain control.

4. The filter stage system of claim 3, further comprising a monitoring component that monitors a scaled version of the input current to mitigate distortion interference.

5. The filter stage system of claim 4, wherein at least one of the continuous time baseband filters, the mirroring component, the scaling component, or the monitoring component is a cryo-electronic component.

6. The filter stage system of claim 1, further comprising a plurality of cascaded continuous time baseband filters in series.

7. The filter stage system of claim 6, wherein a subset of the plurality of cascaded continuous time baseband filters provide low-pass, band-pass or high-pass characteristics with corner frequencies, quality factor, or gain control set by digital control.

8. The filter stage system of claim 1, wherein the feedback loop employs the following equations:

$$Q = \sqrt{\frac{gm1}{gm2} \frac{C2}{C1}},$$

$$BW = \frac{1}{2\pi} \sqrt{\frac{gm1 gm2}{C1 C2}}$$

wherein $C_{1,2}$ are capacitors, $g_{m1}$ is the first transconductance block, $g_{m2}$ is the second transconductance block, Q is a quality factor, and BW is bandwidth.

9. The filter stage system of claim 1, wherein the continuous time baseband filter is single-ended.

10. The filter stage system of claim 1, wherein the continuous time baseband filter is differential.

11. The filter stage system of claim 1, further comprising a set of poles placed between the continuous time baseband filter and the mirroring component to facilitate high-order filtering and mitigate compromising stability of the continuous time baseband filter.

12. A method for quantum computing, comprising:
using a continuous time baseband filter that comprises a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole, wherein the feedback loop comprises the at least one first impedance node, the at least one second impedance node, a buffer, a first transconductance block, and a second transconductance block, and wherein the continuous time baseband filter generates a filtered current; and using a mirroring component that mirrors the filtered current to an output.

13. The method of claim 12, further comprising using the mirroring component to selectively change a mirroring ratio to achieve a variable gain.

14. The method of claim 12, further comprising using a scaling component to scale an input current of the feedback loop to facilitate coarse gain control.

15. The method of claim 14, further comprising using a monitoring component to monitor a scaled version of the input current to mitigate distortion interference.

16. The method of claim 12, further comprising using a set of additional poles placed between the continuous time baseband filter and the mirroring component to facilitate high-order filtering and mitigate compromising stability of the continuous time baseband filter.

17. The method of claim 12, further comprising using a plurality of cascaded continuous time baseband filters in series.

18. The method of claim 17, further comprising using a subset of the plurality of cascaded continuous time baseband filters to provide low-pass, band-pass or high-pass characteristics with corner frequencies, quality factor, or gain control set by digital control.

19. The method of claim 12, further comprising the feedback loop employing the following equations:

$$Q = \sqrt{\frac{gm1}{gm2}\frac{C2}{C1}},$$

$$BW = \frac{1}{2\pi}\sqrt{\frac{gm1\,gm2}{C1\,C2}}$$

wherein $C_{1,2}$ are capacitors, $g_{m1}$ is the first transconductance block, $g_{m2}$ is the second transconductance block, Q is a quality factor quality factor, and BW is bandwidth.

20. A computer program product comprising a non-transitory computer readable medium having program instructions embodied therewith, the program instructions executable by a processor to cause the processor to:
use a continuous time baseband filter that comprises a feedback loop that employs at least one first impedance node and at least one second impedance node, wherein the at least one first impedance node has a higher impedance than the at least one second impedance node, and wherein the at least one first impedance node provides a dominant pole and the at least one second impedance node provides a non-dominant pole, and wherein the feedback loop comprises the at least one first impedance node, the at least one second impedance node, a buffer, a first transconductance block, and a second transconductance block, wherein the continuous time baseband filter generates a filtered current; and
use a mirroring component that mirrors the filtered current to an output.

21. The computer program product of claim 20, the program instructions executable by the processor to further cause the processor to: use the mirroring component to selectively change a mirroring ratio to achieve a variable gain.

22. The computer program product of claim 20, the program instructions executable by the processor to use a scaling component to scale input current of the feedback loop to facilitate coarse gain control.

23. The computer program product of claim 22, the program instructions executable by the processor to further cause the processor to: use a monitoring component to monitor a scaled version of the input current to mitigate distortion interference.

* * * * *